United States Patent [19]

Boulaev

[11] Patent Number: 5,746,828

[45] Date of Patent: May 5, 1998

[54] TEMPERATURE CONTROL SYSTEM FOR GROWING HIGH-PURITY MONOCRYSTALS

[75] Inventor: Anatoli S. Boulaev, Pittsford, N.Y.

[73] Assignee: General Signal Corporation, Stamford, Conn.

[21] Appl. No.: 587,362

[22] Filed: Jan. 16, 1996

[51] Int. Cl.$^6$ .................................................. C30B 35/00
[52] U.S. Cl. ........................... 117/201; 117/202; 117/217; 117/222
[58] Field of Search ........................... 117/13, 14, 15, 117/200, 201, 202, 203, 204, 208, 217, 222

[56] References Cited

U.S. PATENT DOCUMENTS

| | | | |
|---|---|---|---|
| 3,692,499 | 9/1972 | Andrychuk | 117/15 |
| 4,032,389 | 6/1977 | Joyce | 117/202 |
| 4,330,361 | 5/1982 | Kuhn-Kuhnenfeld et al. | 117/30 |
| 4,794,263 | 12/1988 | Katsuoka et al. | 117/201 |
| 4,926,357 | 5/1990 | Katsuoka et al. | 364/560 |
| 5,132,091 | 7/1992 | Azad | 117/217 |
| 5,137,699 | 8/1992 | Azad | 395/855 |
| 5,162,072 | 11/1992 | Azad | 117/202 |
| 5,176,787 | 1/1993 | Kawashima et al. | 117/14 |
| 5,178,720 | 1/1993 | Frederick | 117/201 |
| 5,361,721 | 11/1994 | Takano et al. | 117/214 |
| 5,408,952 | 4/1995 | Wakabayashi et al. | 117/201 |
| 5,437,242 | 8/1995 | Hofstetler et al. | 117/14 |

FOREIGN PATENT DOCUMENTS

| | | |
|---|---|---|
| 1519850 | 12/1974 | Germany . |
| 61-122187 | 6/1986 | Japan . |

OTHER PUBLICATIONS

"Czochralski–Grown Silicon" by Werner Zulehner and Diethart Huber, Crystals 8, Springer–Verlag Berlin Heidelberg, Germany, 1982, pp. 91–102.

"Temperature Oscillations in Silicon Melts", technical paper from Luxtron, Santa Clara, CA, Jan. 1989, 22 pages.

"Thermal Analysis of the Double–Crucible Method in Continuous Silicon Czocharalski Processing" by N. Ono, M. Kida, Y. Arai and K. Sahira, J. Electrochem. Soc., vol. 140, No. 7, Jul. 1993, pp. 2101–2105.

"The Incorporation of Oxygen into Silicon Crystals" by Wen Lin, Semi–conductors and semimetals, vol. 42, by Academic Press, Inc., 1994, pp. 9–52.

"Precision Multi–Channel Temperature Mesurement and Control" Model 100 brochure from Accufiber Inc., Beaverton, Oregon, 1988, 6 pages.

A drawing of what is believed to be a prior crystal growing machine having a radiation shield movable axially of a crucible.

An article entitled "Sumitomo Zone–leveling CZ Techniques" with an accompanying drawing, Japanese Silicon Crystal Manufacturing Technology Newsletter, Jun. 1993, p. 3.

Primary Examiner—Felisa Garrett
Attorney, Agent, or Firm—Eugene Stephens & Associates

[57] ABSTRACT

A crystal-pulling apparatus incorporates a temperature sensor and an adjustable radiation shield. The temperature sensor measures temperatures of a melt surface adjacent to a solidification interface between a crystal and the melt. The radiation shield regulates radiational cooling of the melt. A control system adjusts the radiation shield in response to changes in the measured temperature of the melt for enhancing dislocation-free growth of the crystal.

19 Claims, 9 Drawing Sheets

TEMPERATURE CONTROL SYSTEM FOR GROWING HIGH-PURITY MONOCRYSTALS

TECHNICAL FIELD

The invention relates to the manufacture of monocrystals according to the Czochralski pulling technique and particularly to monitoring and regulating thermal conditions affecting crystal growth during their manufacture.

BACKGROUND

Most monocrystals used for making electronic components (e.g., silicon, germanium, and gallium arsenic) are formed by the Czochralski pulling technique. The substance to be crystallized is melted in a crucible, which is usually made of quartz, and a "seed" crystal is dipped into the melt and slowly withdrawn. The melt crystallizes at the seed, and the crystal grows to dimensions controlled by a rate of pulling the crystal from the melt.

The growth of dislocation-free crystals is sensitive to variations in both temperature and the pulling rate. For example, a temperature of approximately 1415 degrees centigrade is required at the solidification interface between a crystal of silicon and a silicon melt. Temperatures elsewhere in the melt must be higher, and temperatures elsewhere in the crystal must lower. Any variation in the temperature gradient in the vicinity of the solidification interface can affect the rate of crystal growth as well as its quality.

The pulling rate is varied in response to the detection of diametric variations in the growing crystal to maintain the crystal diameter within a desired tolerance. However, the variations in pulling rate must be limited to maintain dislocation-free growth of the crystal and to minimize changes in the composition of the crystal throughout its length. Conversely, oversized diameters require excess grinding and undersized diameters produce scrap.

Radiational heating units surrounding the crucible are controlled to limit variations in the pulling rate by regulating the overall temperature of the melt. The heating units surrounding small crucibles generally provide adequate control over the required thermal gradients in the vicinity of the solidification interface to limit variations in the rate of crystal growth. However, the increased mass of the melt and heated components surrounding larger crucibles for growing crystals in excess of 200 mm in diameter limits the control of the heating units over the required thermal gradients.

Variations in the heat output of the surrounding heaters are slow to affect temperatures at the solidification interface of the larger crystals and have little affect on more rapid temperature fluctuations within the melt. For example, the rate at which the heaters can influence temperatures at the solidification interface of large crystals is often too slow (e.g., delays up to 5 or 10 minutes) to effectively regulate many temperature fluctuations affecting crystal growth. Thus, the growth of large dislocation-free crystals is hampered by inadequately controlled variations in temperature gradients in the vicinity of the solidification interface and by the accompanying variations in the pulling rate required to maintain the desired diameter of the growing crystals.

The two primary controls over crystal growth, namely, pulling rate and radiational heating, are both based on error measures of crystal diameter, which presuppose some prior deviation from the required thermal gradients. Thus, the thermal conditions in the vicinity of the solidification interface can fluctuate well in advance of their detection from the resulting diameter change. The direct monitoring of thermal conditions at the solidification interface would provide an opportunity for better control over the crystal growing process. However, such further control over the radiational heaters would be of limited use for growing large crystals because of the slow response to changes in radiational heating in the vicinity of the solidification interface.

U.S. Pat. No. 5,162,072 to Azad discloses individually controlled heating elements arrayed in rings beneath a crucible to regulate radial temperature distributions across the bottom of the crucible. The radial temperature distributions across the crucible bottom are regulated to maintain stable convection flow patterns despite reductions in the melt level. However, the additional heating units provide little immediate control over temperature gradients in the vicinity of the solidification interface, especially in larger size crucibles.

U.S. Pat. No. 4,330,361 to Kuhn-Kuhnenfeld et al. discloses use of a downwardly tapering radiation screen surrounding a growing crystal as it emerges from a melt within a crucible. The screen, which can be used throughout the pulling process, protects the growing crystal from irradiation of heat from the melt, the crucible walls, and one or more heater elements. Although the screen most probably has some general affect on temperature patterns near the solidification interface, the screen does not provide any more control over temperature fluctuations that vary the growing rate of the crystal.

SUMMARY OF INVENTION

My invention provides for more directly monitoring thermal conditions affecting crystal growth and for more accurately regulating the monitored thermal conditions to enhance the growth of dislocation-free crystals. The thermal conditions can be monitored by sensing temperatures in the vicinity of a solidification interface between the crystals and a melt. The thermal conditions can be regulated by controlling an amount of radiational cooling from a surface of the melt.

One example of my invention includes a processing chamber within which a crucible is mounted for containing a melt of crystal-forming material. The crucible has an open end through which a crystal can be pulled from the melt. A heater maintains the crystal-forming material in a melted condition. In addition to these usual features, a temperature monitor senses a temperature of the melt adjacent to the solidification interface between the crystal and the melt and a radiation regulator regulates radiational cooling of the melt. A control system adjusts the radiation regulator in response to changes in the sensed temperature of the melt for enhancing dislocation-free growth of the crystal.

The new temperature monitor preferably includes a probe that extends into the processing chamber more than one-fifth of a distance between the processing chamber and the melt. A sight tube within the probe transmits radiant energy from a spot on the surface of the melt to an optical sensor. The spot, which preferably measures less than 10 mm in diameter, is located beyond the solidification interface but within an area in which the sensed temperatures are directly correlated with the rate of crystal growth. For example, the spot is preferably positioned between 5 mm and 50 mm from the crystal.

The new radiation regulator is preferably a radiation shield that covers an area over the open end of the crucible for returning radiated heat to the melt. The amount of radiated heat returned to the melt can be regulated either by adjusting the position of the radiation shield with respect to the melt surface or by adjusting the amount of area covered by the shield. For example, the radiation shield can be formed by an iris diaphragm having a plurality of overlapping plates that can be adjusted to vary the size of an opening through which the crystal is pulled from the melt. The opening is centered with respect to an axis along which the crystal is pulled to promote a radially symmetric temperature distribution in the melt surrounding the crystal.

The new control system relates the temperature monitor to the radiation regulator. A setting of the radiation regulator is adjusted in response to a difference between the sensed temperature of the melt and a desired temperature. For example, the difference between the sensed and desired temperatures can be converted into a temperature control signal that adjusts either the position or the amount of area covered by the radiation shield. Temperature gradients between the solidification interface and the surrounding melt surface can be increased by moving the shield away from the melt surface or by decreasing the area covered by the shield and can be decreased by moving the shield closer to the melt surface or by increasing the area covered by the shield. The closer position and increased area also reduce radiational cooling from the melt surface, which can be used to increase temperatures in the vicinity of the solidification interface.

The much slower responding heater can be used to keep the covered area of the radiation shield within bounds at which it is most effective for favorably influencing temperature gradients of the melt. In fact, the average amount of area covered by the radiation shield can be gradually changed in response to variations in the amount of melt remaining in the crucible. Ordinarily, such variations adversely affect radial temperature gradients of the melt surface required to maintain a stable solidification interface shape. However, according to my invention, the gradual change in the position or average area covered by the radiation shield can be used to maintain the desired radial temperature gradient, while more rapid changes in the shield position or area can be used to stabilize temperatures at the solidification interface.

The improved temperature stability of both the solidification interface and the radial temperature gradient is expected to improve crystal structure and consistency, to reduce diametrical variations in crystal size, to optimize pulling rates, to lower power requirements, and to lessen risk of dislocations caused by temperature shocks and cooling strains. It might also be possible to maintain a desired crystal diameter without varying the pulling rate by varying the area covered by the radiation shield to stabilize crystal growth rates.

DRAWINGS

DETAILED DESCRIPTION

Figure 1:
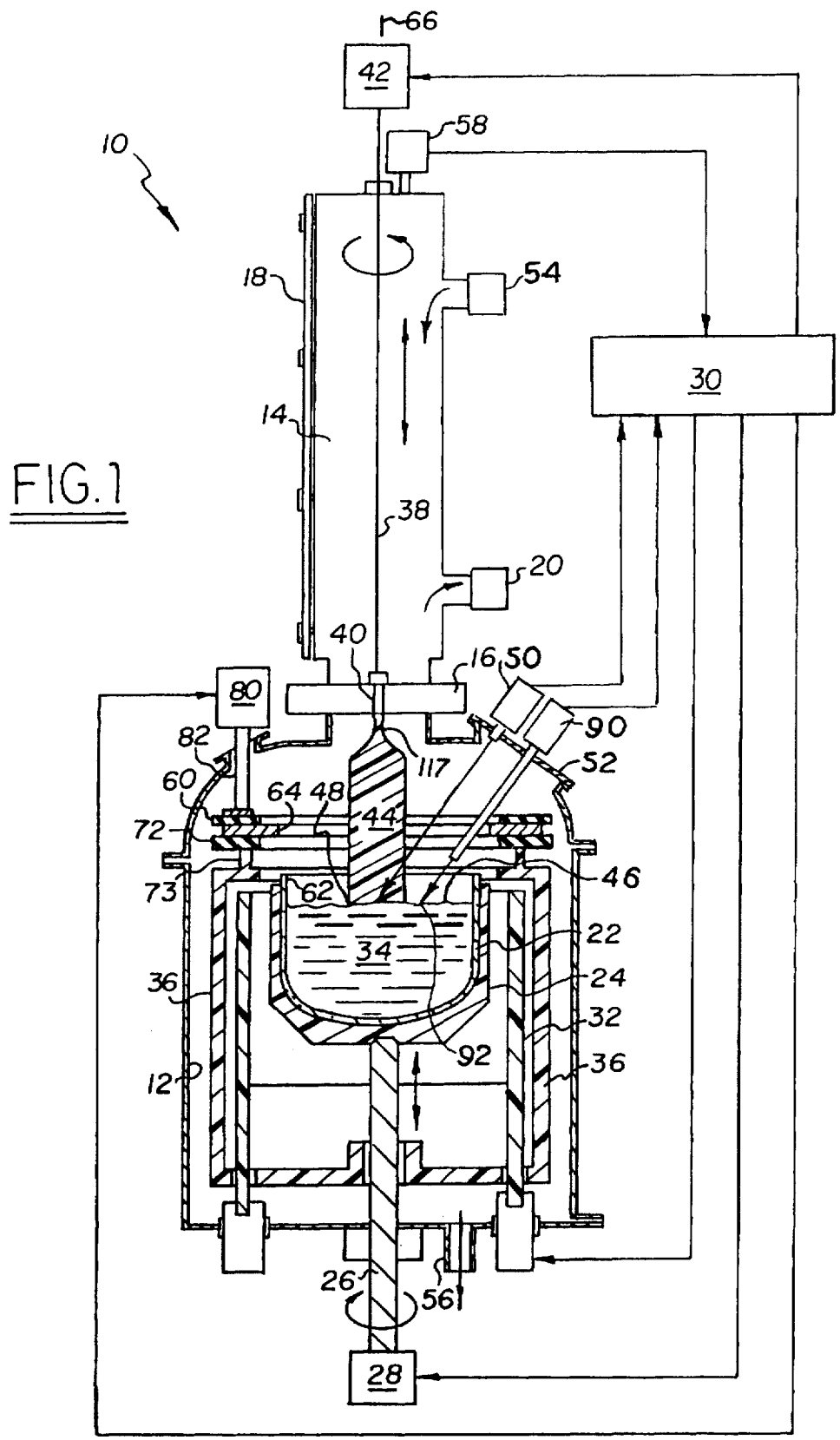
FIG. 1 is a schematic cross-sectional elevation view of a Czochralski pulling apparatus modified according to my invention.

One embodiment of my invention is depicted in FIG. 1 as an improved apparatus 10 for growing crystals according to the Czochralski pulling technique. The apparatus 10 includes an evacuatable processing chamber 12 and a loading chamber 14 interconnected by a valve 16. A door 18 provides access to the loading chamber 14. Both chambers 12 and 14 are evacuated by a pump 20, although separate pumps for each chamber could also be used. The valve 16 can be closed to maintain vacuum pressure in the processing chamber 12 when the door 18 of the loading chamber 14 is open.

Within the processing chamber 12 is a silica (quartz) crucible 22 contained in a graphite support 24 that is mounted on a crucible shaft 26. A lower drive mechanism 28 provides for both rotating and vertically translating the crucible shaft 26 under directions from a computer processor 30. A graphite resistance heater 32, also under computer control, surrounds the silica crucible 22 and graphite support 24 for melting crystal-forming material 34 such as silicon, germanium, or gallium arsenic within the silica crucible 22 and for maintaining the crystal-forming material 34 in a melted condition. A thermal shield 36, which can also be made of graphite, protects walls of the processing chamber 12 from extreme heat generated by the heater 32.

A seed cable (or shaft) 38 extends through the loading chamber 14 and into the processing chamber 12 for supporting a seed crystal 40. An upper drive mechanism 42 provides for both rotating and vertically translating the seed cable 38 under the control of the computer processor 30. Vertical movement of the seed cable 38 is used to dip the seed crystal 40 into the melted crystal-forming material 34, hereinafter "melt", and to withdraw the seed crystal 40 from the melt 34 at a rate that grows a dislocation-free crystal 44 to a desired radial dimension (i.e., diameter).

Vertical movement of the crucible shaft 26, together with the crucible 22, can be used to maintain a surface 46 of the melt 34 in an optimum position or level with respect to the heater 32. Also, the crucible shaft 26 and the seed cable 38 are rotated in the same or opposite directions to manage convection currents within the melt 34 and to improve radial symmetry of a solidification interface 48 between the crystal 44 and the melt 34.

An optical sensor 50 operating through a port 52 in the processing chamber 12 functions as a diameter monitor for measuring the diameter of the crystal 44. Optical pyrometers such as disclosed in U.S. Pat. No. 3,692,499, X-rays such as disclosed in German Patent 1,519,850, and load monitoring of crystal weight such as disclosed in U.S. Pat. No. 4,032,389 could also be used to obtain comparable measures. The measure of crystal diameter, which is a function of both the pulling rate and the temperature conditions at the solidification interface 48, is transmitted to the computer processor 30 for evaluation of any error and determination of any corrective actions.

An inert gas such a argon is circulated between an entry port 54 and an exit port 56 for purging contaminants evaporated from heated components in the processing chamber 12 as well as from the melt 34.

In addition to these standard features of the illustrated embodiment, my invention includes an iris diaphragm 60 that functions as a radiation shield covering an area over an open end 62 of the crucible 22 for returning radiated heat to the melt 34. The iris diaphragm 60 has a variably sized opening 64 through which the crystal 44 can be pulled from the melt 34. The size of the opening 64 is controlled to adjust the amount of area covered by the iris diaphragm 60. Also, the opening 64, which is substantially circular, is centered with respect to an axis 66 along which the crystal 44 is pulled for radially symmetrically affecting temperature gradients in the melt 34 surrounding the solidification interface 48.

Figure 2:
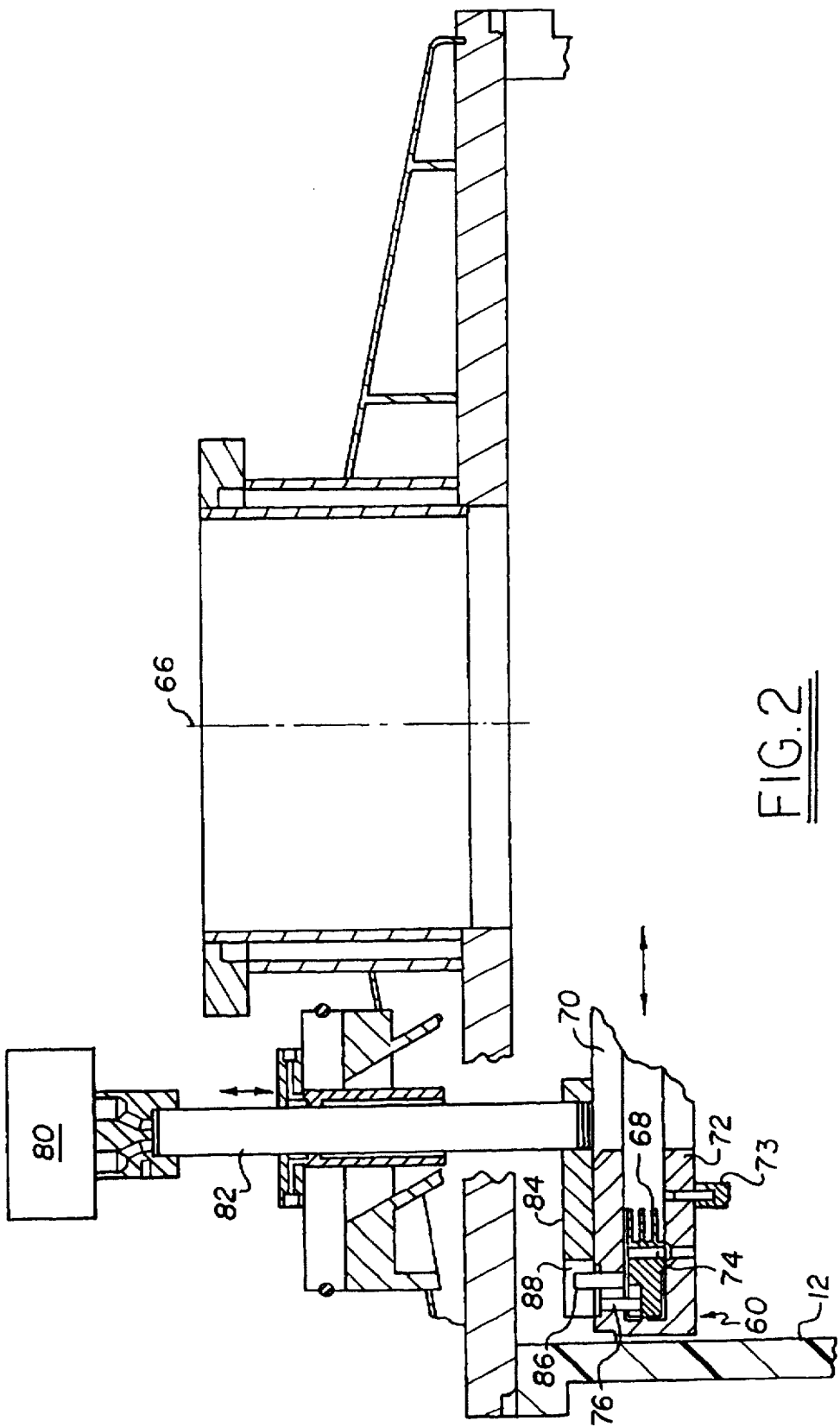
FIG. 2 is a cut-away portion of the apparatus showing an axial cross section of an iris diaphragm.
Figure 3:
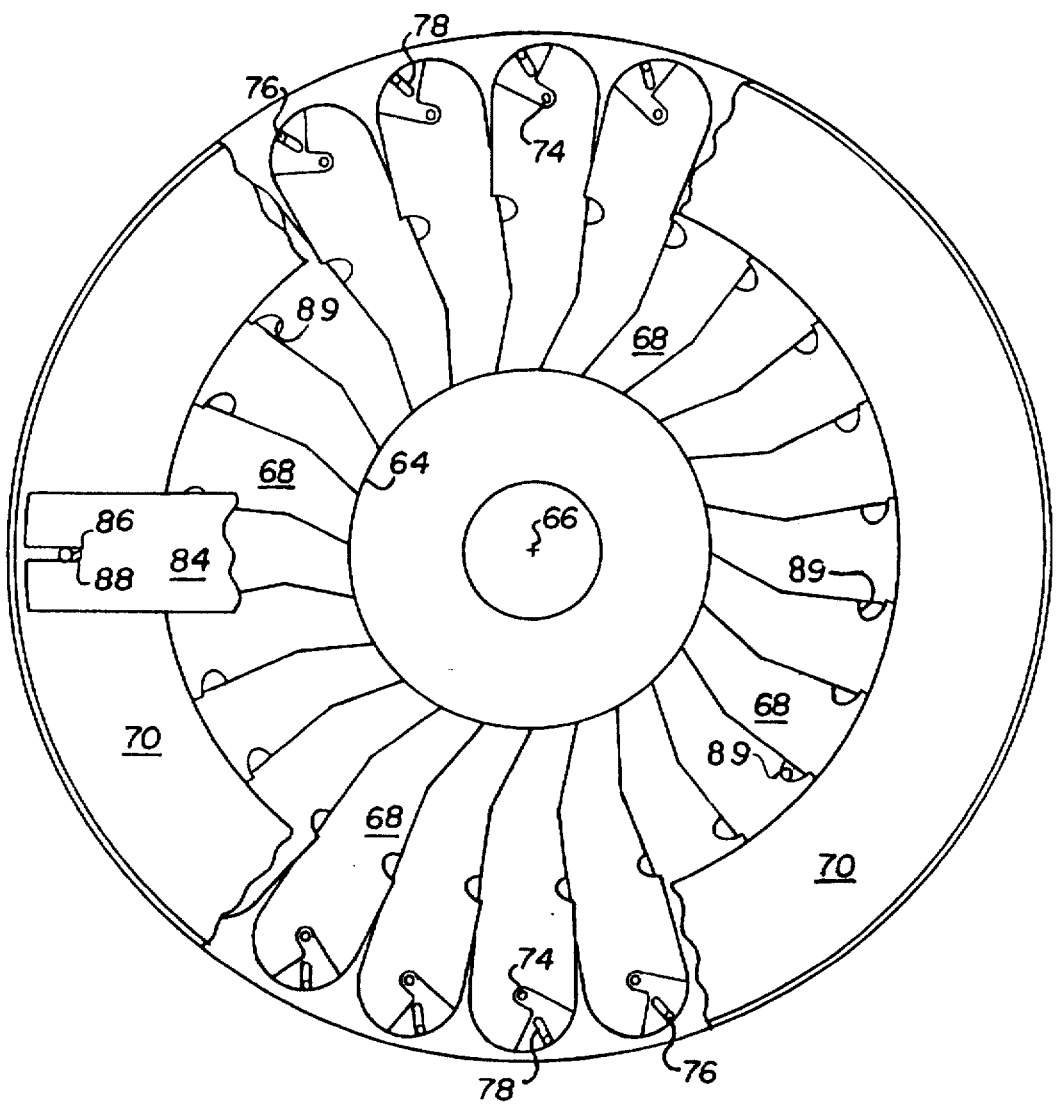
FIG. 3 is a partly cut-away top view of the iris diaphragm showing overlapping plates in a maximum closed position.
Figure 4:
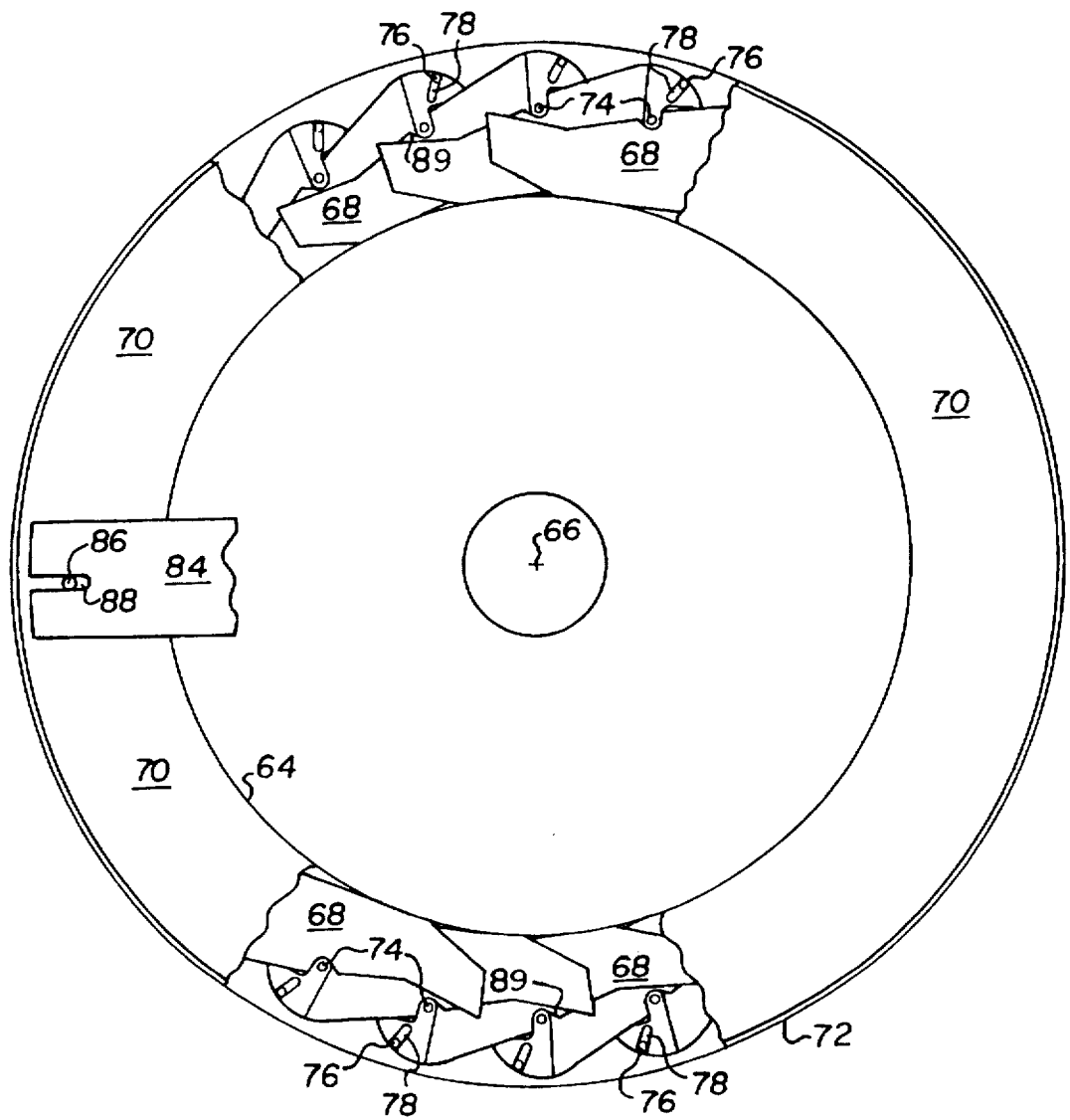
FIG. 4 is a similar view of the iris diaphragm showing the overlapping plates in a maximum open position.

The iris diaphragm 60, which is shown in more detail in FIGS. 2–4, is formed by overlapping plates 68 that can be adjusted to vary the size of the opening 64. The overlapping plates 68 are supported between a pair of rings 70 and 72 that are relatively rotatable for moving the overlapping plates 68 between different angular positions. The overlapping plates 68 are preferably made of graphite or molybdenum, and the rings 70 and 72 are preferably made of graphite.

The lower ring 72 is supported on the thermal shield 36 by a graphite tube 73. The overlapping plates 68 are rotatively supported on pins 74 carried by the lower ring 72. The upper ring 70 is rotatively supported on a rim of the lower ring 72. Pins 76 carried by the upper ring 70 engage slots 78 in the overlapping plates 68 so rotation of the upper ring 70 pivots the overlapping plates 68 between the different angular positions contrasted by FIGS. 3 and 4.

The upper ring 70 is rotated by an iris drive mechanism 80 under control of computer processor 30 through a water-cooled iris shaft 82 and crank arm 84. A pin 86 carried by the upper ring 70 engages a slot 88 in the crank arm 84 for converting angular motion of the crank arm 84 into rotation of the upper ring 70.

In FIG. 3, the overlapping plates 68 are pivoted into angular positions that cover the most area of the crucible opening 62 and that provide the smallest central opening 64. In FIG. 4, the overlapping plates 68 are pivoted into angular positions that cover the least area of the crucible opening 62 and that provide the largest central opening 64. Scallops 89 in the overlapping plates 68 provide clearance with the pins 74 to maximize the size of central opening 64.

The iris drive mechanism 80 can also be arranged to move the iris diaphragm 60 vertically to adjust the height of the iris diaphragm 60 above the melt surface 46. The overall radiational effects of the iris diaphragm 60 increase with proximity to the melt surface. The ability to vary both the height and the opening size of the radiation shield enables further optimization of temperature gradients within the melt. This is particularly helpful for establishing a dislocation-free neck region at the start of crystal growth. Vertical movement of the iris diaphragm 60 can also be used during melt-down to maintain a minimum clearance with the crystal-forming material 34 as the material settles into the crucible 22.

A similar radiation shield is disclosed in more detail in my copending application filed on 20 Nov. 1995 entitled "Adjustable Radiation Shield for Controlling Temperature in Crystal-Forming Apparatus". This application is hereby incorporated by reference.

Figure 5:
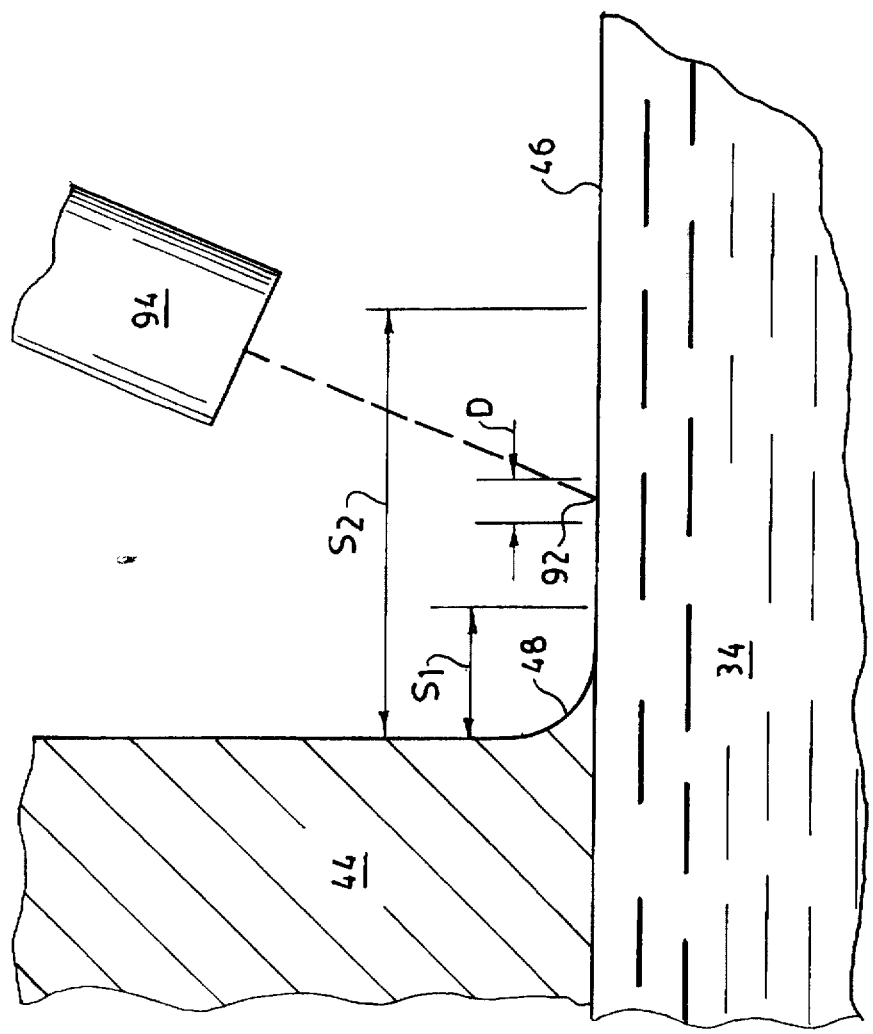
FIG. 5 is a cut-away elevation view in cross section within a portion of the pulling apparatus in the vicinity of a solidification interface between a crystal and a melt.

My invention also includes a second optical sensor 90 operating through the port 52. The optical sensor 90, which is further illustrated by FIGS. 5, 6A, and 6B, functions as a temperature monitor for measuring the temperature of a spot 92 on the melt surface 46 adjacent to the solidification interface 48. The spot 92, which is located along a radial temperature gradient, has a diameter "D" that is preferably limited in size so the amount of temperature variation within the spot 92 is less than about 2 degrees centigrade, with less than 1 degree centigrade being more preferred. The temperature variation within the spot 92 is also preferably less than an expected variation in the average temperature of the spot 92 during crystal growth. Diameters "D" satisfying these criteria are expected to range between 2 mm and 20 mm.

The spot 92 is radially spaced from the crystal 44 between minimum and maximum distances "$S_1$" and "$S_2$". The minimum distance "$S_1$", which is generally not less than 5 mm, positions the spot 92 on the melt surface 46 beyond the solidification interface 48 at which the melt curves to join the growing crystal 44. Some tolerance for eccentricity or wobble of the solidification interface 48 should also be incorporated into the minimum distance "$S_1$" to assure that the spot 92 lies entirely within a plane of the melt surface 46.

The maximum distance "$S_2$" which is generally not greater than 50 mm, positions the spot 92 within an area of the melt surface 46 whose temperature is directly correlated with growth rates at the solidification interface 48 (e.g., higher temperatures decrease growth rates and lower temperatures increase growth rates). Beyond the distance "$S_2$", melt temperatures are not sufficiently predictive of the growing conditions. For example, the temperature gradients may be too non-linear to effectively measure, or the temperature variations may be too volatile to be meaningfully related to the growing rate. Melt temperatures within the distance "$S_2$" are preferably within 25 degrees centigrade of the solidification interface 48.

Figure 6A:
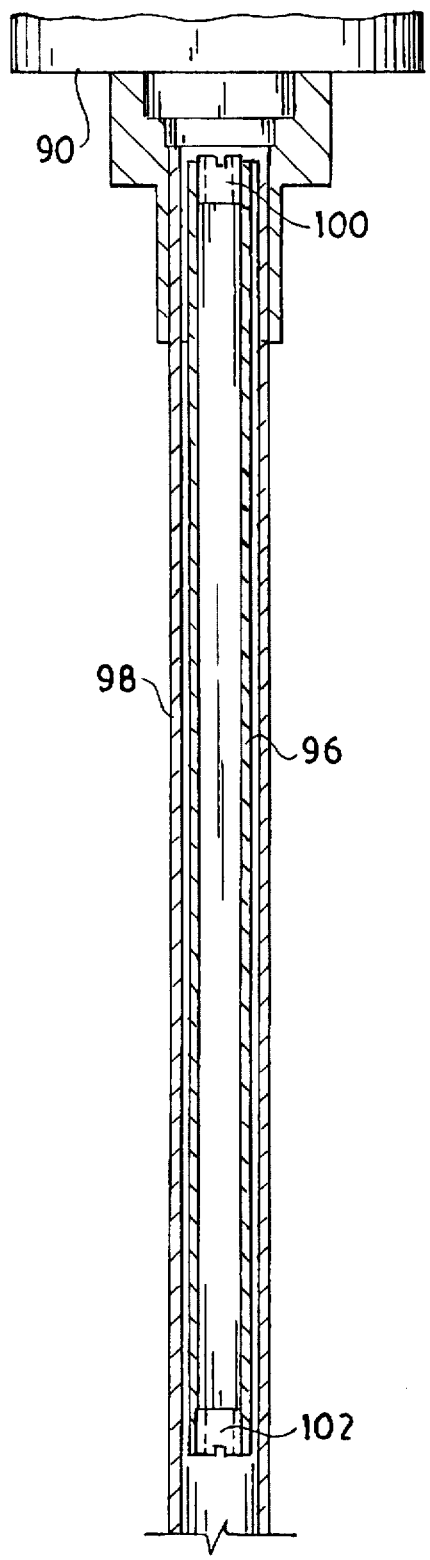
FIGS. 6A and 6B are partial side views in cross section showing different portions of a temperature probe.
Figure 6B:
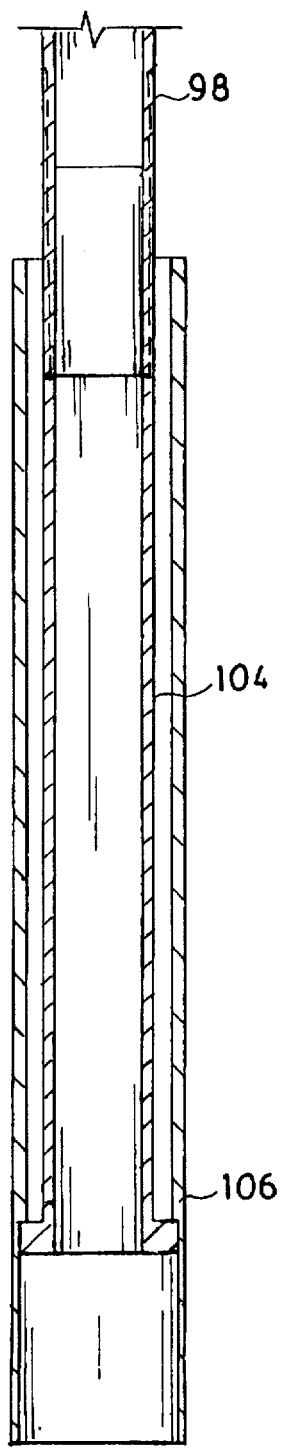

FIGS. 6A and 6B show details of a probe 94 attached to the optical sensor 90 for sizing and positioning the spot 92 on the melt surface 46. The probe 94 includes a sight tube 96 for conveying light between the spot 92 and the optical sensor 90. The sight tube 96 is encased within a protective upper jacket (or sheath) 98. Both the sight tube 96 and the upper jacket 98 can be made from stainless steel. Within the sight tube 96, two aperture stops 100 and 102 are relatively adjustable for controlling the size of the spot 92.

A lower jacket 104 is threadably engaged with the upper jacket 98 and is itself encased within a protective sheath 106, which is preferably made of graphite. In some circumstances, the upper jacket 98 alone may be of sufficient length to exclude radiation from other sources that could affect the temperature measurement. However, if additional length is needed, the lower jacket 104 and the protective sheath 106 can be used to extend the probe 94 into a region of higher temperature approaching the melt surface 46. Preferably, the probe 94 extends into the processing chamber 12 more than one-fifth of a distance between the processing chamber 12 and the melt surface 46.

Figure 7:
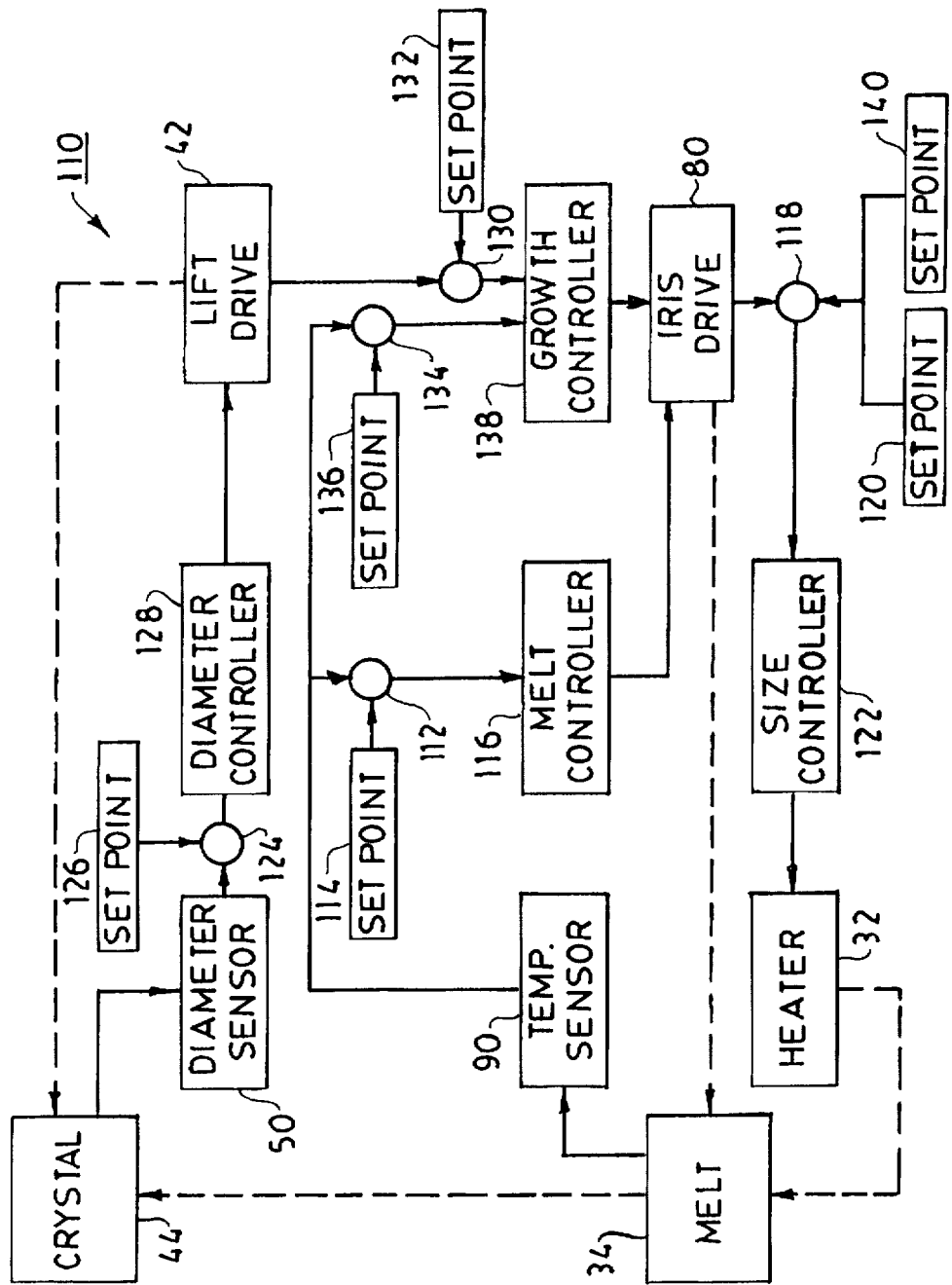
FIG. 7 is a diagram of a control system for regulating melt-down and crystal growth within the pulling apparatus.

A new control system 110 incorporating both the iris diaphragm 60 and the temperature sensor 90 is shown in FIG. 7. The control system 110 supports two main operations, namely, melt-down and crystal growth. Preferably, information is processed within the control system 110 by software residing in the computer processor 30. However, various operations of the control system 110 could also be performed by separate hardware controls.

During melt-down, pieces of the crystal-forming material 34 are added to the crucible 22 and heat is applied by the heater 32. The temperature sensor 90 measures the temperature of the melt surface 46 and relays this information to the computer processor 30, where a temperature comparator 112 determines a difference between the measured temperature and a predetermined temperature held by a set point 114. An error signal representing the difference between the measured and predetermined temperature values is output from the temperature comparator 112 to a melt temperature controller 116. A control algorithm (such as a proportional differential integral control algorithm) within the melt temperature controller 116 converts the error signal into a control signal for regulating the size of the opening 64 in the iris diaphragm 60.

For example, the opening 64 is reduced in size when the melt temperature is too low to trap more heat within the melt 34, and the opening 64 is increased in size when the melt temperature is too high to release more heat from the melt 34. A size (area setting) comparator 118 determines a difference between the actual size of the opening 64 and a predetermined size held by a set point 120 representing an opening size at which the iris diaphragm 60 is most effective for optimizing the melt temperature. An error signal representing the difference between the actual and predetermined size of the opening 64 is output from the size comparator 118 to a size (or area setting) controller 122 for regulating the amount of power supplied to the heater 32.

Instead of controlling the heater 32 directly in response to temperature variations in the melt 34, the size controller 122 produces a control signal that regulates heater power to optimize the opening size of the iris diaphragm 60. Preferably, the diaphragm opening 64 is kept as small as possible to relatively increase the temperature of the melt 34 with respect to the crucible 22. This enables a reduction in the temperature of the crucible 22 as well as other components in the processing chamber 12 including the heater 32. The reduced temperature also reduces solubility of the silica crucible 22 and slows chemical reactions of the other components that produce contaminants. As a result, the melt 34 retains a higher purity level, which improves crystal quality, and lifetime of the crucible 22, heater 32, and other processing chamber components is increased.

Also, the temperature sensor 90 together with its probe 94 provides an exact measure of the temperature of the melt surface 46 at a predetermined position of the spot 92. The more exact temperature information enables a further stabilization of the melt conditions required for the start of crystal growth.

During crystal growth, the diameter sensor 50 measures the diameter of the crystal 44. A diameter comparator 124 determines a difference between the measured diameter of the crystal 44 and a predetermined diameter from a set point 126. The predetermined diameter of the set point 126 is determined as a function of the position of the seed cable 38. For example, when the seed crystal 40 is first withdrawn from the melt 34 by vertical movement of the seed cable 38, the diameter of the growing crystal 44 is reduced to about 3 to 5 mm to ensure dislocation-free growth. This so-called "crystal neck" 117 (FIG. 1) extends about 100 to 200 mm in length. Thereafter, the crystal diameter is increased until it reaches a predetermined body diameter (e.g., 200 or 300 mm) at which most of the remaining crystal 44 is grown.

A diameter controller 128 converts a diameter error signal output from the diameter comparator 124 into a control signal for regulating the speed at which the upper drive mechanism 42 lifts the seed crystal 40 from the melt 34. For example, the lift speed (also referred to as pulling rate) is increased when the crystal diameter is too large and the lift speed is decreased when the crystal diameter is too small.

Changes in both the lift speed and the melt temperature are monitored throughout the growth of crystal 44. A rate comparator 130 determines a difference between the actual lift speed and a predetermined speed from a set point 132, which is a function of the crystal length (e.g., the seed cable 38 position). Similarly, a temperature comparator 134 determines a difference between the measured temperature adjacent to the solidification interface 48 and a predetermined temperature from a set point 136, which is also a function of crystal length. The two set points 132 and 136 can be extrapolated from experimental data reflecting desired trends for optimum crystal growth.

A growth controller 138 combines (e.g., weighs and sums) a lift speed error signal from the rate comparator 130 with a temperature error signal from the temperature comparator 134 and converts the combined error signal into a control signal for regulating the size of the opening 64 in the iris diaphragm 60. Variations in the opening size of the diaphragm 60 affect temperature conditions of the melt surface 46, including the measured temperature conditions near the solidification interface 48 that determine crystal growth rates. Enlarging the opening 64 cools the solidification interface 48 and increases crystal growth rates, and contracting the opening 64 heats the solidification interface 48 and decreases crystal growth rates.

Since growth rates affecting the crystal diameter are influenced by temperatures of the melt surface 46 near the solidification interface 48, the temperature error signal from the comparator 134 can be used as the primary control variable for regulating the size of the opening 64 in the iris diaphragm 60. In other words, controlling the iris diaphragm 60 to minimize the temperature error signal is also expected to reduce the lift error signal by reducing the variation in crystal growth rates. However, the lift error signal can still be used by the growth controller 138 as a secondary control variable to compensate for any errors in the set points 132 and 136 or for other temperature-related conditions affecting crystal growth.

Lift speeds that are too fast are controlled by decreasing the size of opening 64, and lift speeds that are too slow are controlled by increasing the size of opening 64. The iris diaphragm 60 affects growing conditions at the solidification interface 48 much faster than would otherwise be possible by controlling the heater 32 alone. As a result, the quality of the crystal 44 is improved and the risk of a loss of desired crystal structure is reduced. Faster overall pulling rates are made possible by the further optimization of temperatures at the solidification interface 48.

The size comparator 118 also determines differences between the actual size of the opening 64 and predetermined sizes that are optimum for controlling neck and body growth. A set point 140 holds predetermined sizes determined to be optimum for stabilizing temperatures at the solidification interface 48 during both neck and body growth. Either predetermined size can be related by function to other processing variables including the respective positions of crucible shaft 26 and seed cable 38.

The size controller 122 includes algorithms for determining appropriate responses from the heater 32 to keep the iris opening near its desired size. For example, if the opening 64 is too large, power to the heater is reduced; and if the opening 64 is too small, power to the heater is increased. Since the ability to change the opening size to rapidly affect temperatures near the solidification interface 48 is generally more important than maintaining any particular opening size, the much slower effects of the heater 32 on temperatures at the solidification interface 48 are sufficient to keep the iris opening within a range of sizes at which it remains effective for stabilizing the solidification interface temperatures.

In addition, more gradual changes in the size of the iris opening can be used to maintain a more stable radial temperature gradient in the melt surface 46 from beginning to end of crystal growth. Generally, radial temperature gradients from the center to the periphery of the crucible 22 diminish with a reduction in the amount of melt 34 remaining in the crucible 22. The reduced gradient requires a reduction in the lifting rate and can adversely affect the shape of the solidification interface 48, which increases risk of a loss of desired crystal structure. In extreme cases, solidification can occur elsewhere in the crucible 22.

Neck growth in large crucibles 22 (e.g., 550 mm diameters) required to grow large crystals 44 (e.g., 200 or 300 mm diameters) is particularly difficult because of large temperature variations (e.g., 100–200 degrees centigrade) between the center and periphery of the large crucibles 22. Closing the iris diaphragm 60 reduces radial temperature gradients in the melt surface 46 and thereby provides improved conditions at the center of large crucibles 22 for promoting growth of crystal necks 117. Further optimization of the radial temperature gradients can be achieved by relating vertical positions of the crucible 22 to opening sizes of the iris diaphragm 60.

Figure 8A:
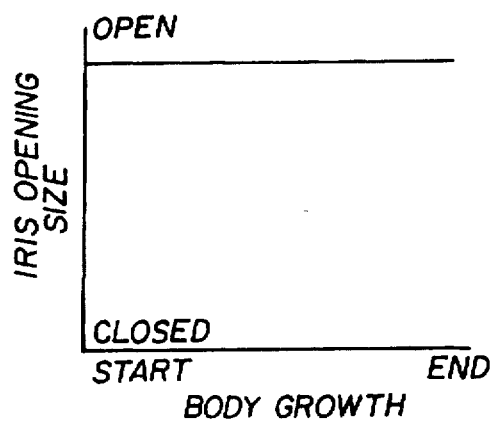
FIGS. 8A–8F are a series of graphs showing relationships between processing variables with a fixed iris opening size throughout a range of crystal growth.
Figure 9A:
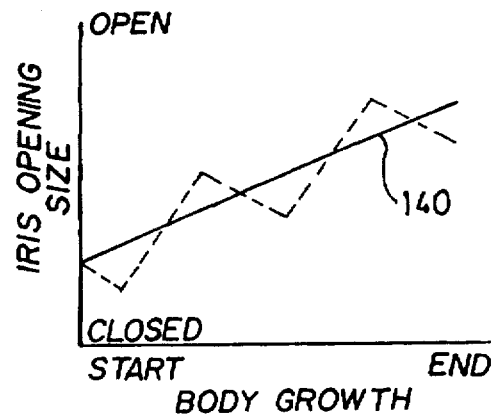
FIGS. 9A–9F are a series of graphs showing relationships between the same processing variables with variable iris opening sizes throughout a similar range of crystal growth.
Figure 8B:
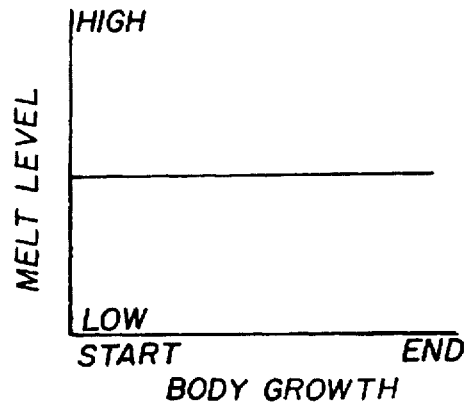
Figure 9B:
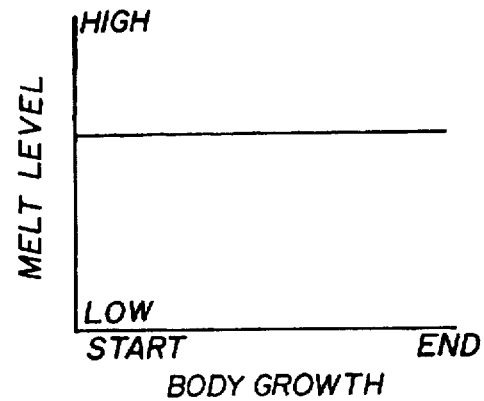
Figure 8C:
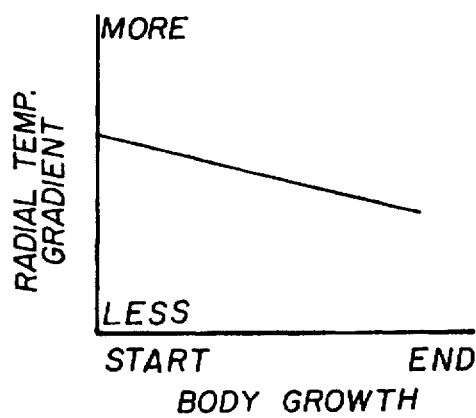
Figure 9C:
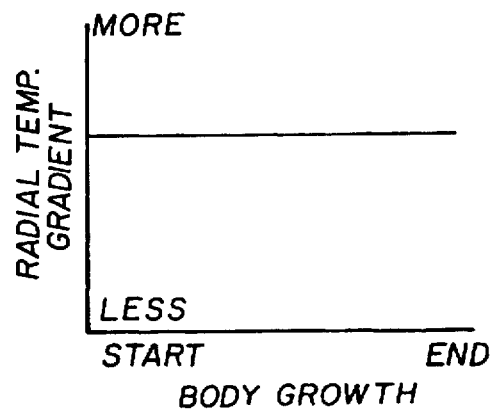
Figure 8D:
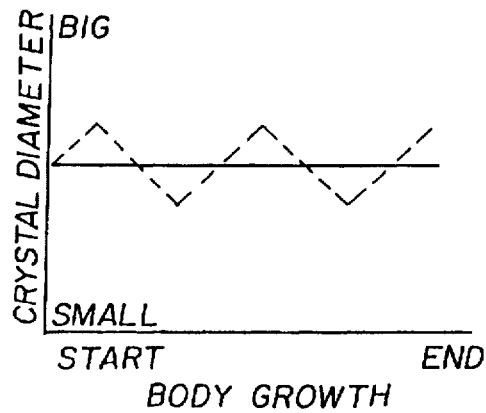
Figure 9D:
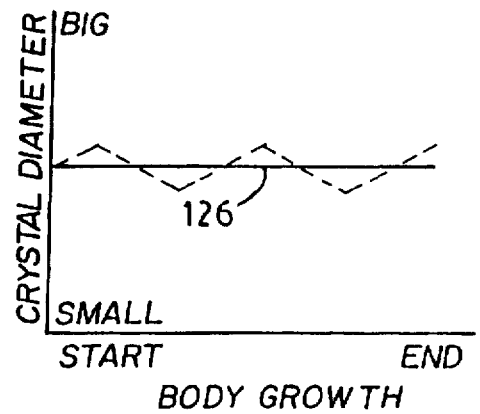
Figure 8E:
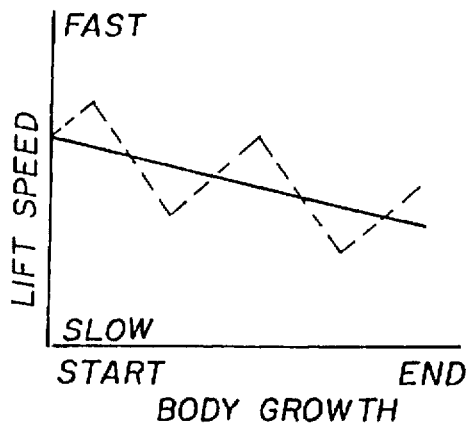
Figure 9E:
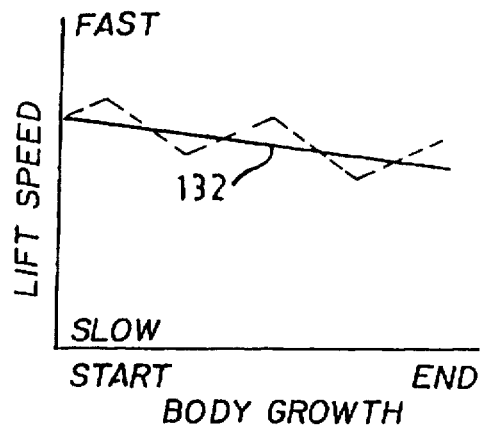
Figure 8F:
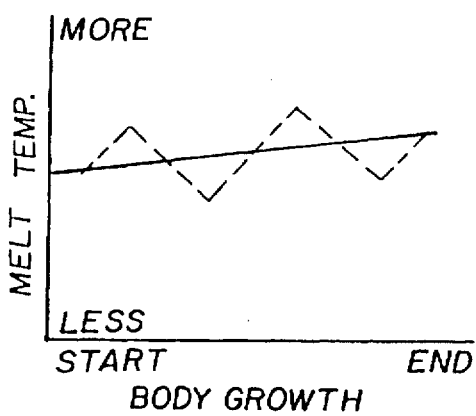
Figure 9F:
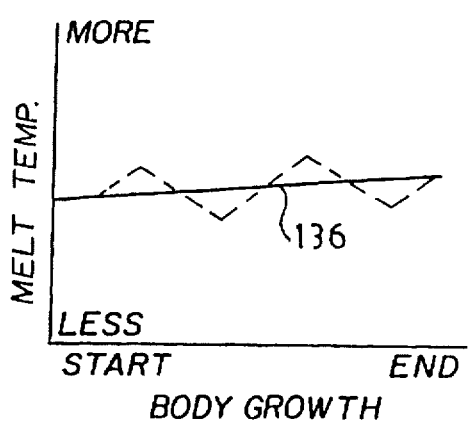

The remaining drawing figures contrast the performance of my new crystal pulling apparatus, which includes using a measurement of melt temperature adjacent to the solidification interface to control the iris opening size, with conventional crystal pulling apparatus. Graphs compare various processing variables throughout similar ranges of crystal body growth. FIGS. 8A–8F illustrate the conventional relationships between the processing variables without any control over iris opening size. This is represented in FIG. 8A as an arbitrarily fixed iris opening size. FIGS. 9A–9F illustrate new relationships of the processing variables made possible by controlling iris opening size. Where solid and dashed lines appear together on the graphs, the solid lines represent set point values of the processing variables and the dashed lines represent exemplary actual values of the same processing variables.

Normally, both the radial temperature gradient and the affected lift speed tend to significantly decrease from beginning to end of body growth, leading to inconsistencies in crystal composition. In the illustrated embodiment, my invention provides for minimizing such variations to improve crystal quality. The set point iris opening size 134 at the start of body growth is mostly closed but gradually opens with increasing length of crystal growth. The melt level, which is generally maintained at a constant height with respect to the heater 32 by vertical movement of the crucible 22, is maintained at a slightly greater height than usual.

Raising the melt level with respect to the heater 32 tends to increase the radial temperature gradient. However, closing the iris opening 64 tends to lower the radial temperature gradient. The iris diaphragm 60 is initially closed to suppress some of the increased gradient effect of the raised melt level but is gradually opened to compensate for the decreased gradient effect of the reduced amount of the melt 34.

Thus, a first order variation (i.e., slope) in the set point iris opening size 134 can be used to reduce variation of the radial temperature gradient between the beginning and end of crystal growth. This also has the effect of reducing a first order variation (i.e., slope) of the set point lift speed 136, thereby making possible an improvement in the consistency of crystal composition between the beginning and end of body growth. The conservation of heat within the melt 34 at the beginning of body growth is also expected to lower overall power consumed by the heater 32.

Higher order variations in iris opening size limit the higher order variations in both the lift speed and the temperature adjacent to the solidification interface 48. Since the crystal diameter is a function of temperature patterns in the vicinity of the solidification interface 48 and the variations in the iris opening size directly affect these temperatures, the further variation in the size of the iris opening 64 by the growth controller 138 also reduces variations in the diameter of the crystal 44. The reduction in the range of diameter variation improves the dimensional stability of the crystal 44. The corresponding reduction in the range of lifting speeds further improves the quality of the crystal 44. Also limited are accelerations in the lift speed that could disrupt the dislocation free growth of the crystal 44. The heater 32 is applied to a more suitable task of controlling the first order change in iris opening position from beginning to end of body growth.

A variety of other control system configurations can also be used for exploiting the new information provided by the temperature sensor 90 and the temperature-regulating capabilities of the iris diaphragm 60 or other radiation shields positioned over the melt surface 46. For example, separate control loops could be used for controlling the lift drive 42 and the iris drive 80. The lift drive 42 would be controlled to regulate crystal diameter, and the iris drive 80 would be controlled to regulate temperatures adjacent to the solidification interface 48.

Alternatively, the iris diaphragm 60 or other radiation shield could be used in place of the upper drive mechanism 42 for regulating both crystal diameter and temperatures adjacent to the solidification interface 48. For example, instead of varying the lifting rate, the area covered by the radiation shield would be varied in response to the measured temperatures adjacent to the solidification interface to control crystal diameter. The position of the radiation shield over the melt could also be used in place of varying the amount of area covered by the shield or in addition to varying the same to enhance the regulation of radiational cooling from the melt surface 46.

The temperature sensor 90 could be moved to different positions during crystal growth, especially between neck and body growth. Also, more than one temperature sensor 90 could be used to gather additional information about temperature patterns in the vicinity of the solidification interface.

I claim:

1. An apparatus for growing crystals from a melt of crystal-forming material comprising:

a processing chamber;

a crucible mounted in said processing chamber for containing the melt of crystal-forming material and having an open end through which the crystal can be pulled from the melt;

a heater that maintains the crystal-forming material in a melted condition within the crucible;

a temperature monitor that senses a temperature of the melt in the vicinity of a solidification between the crystal and the melt;

a radiation shield that is adjustable for regulating an amount of radiated heat that is returned to the melt; and a control system that adjusts the radiation shield in response to changes in the sensed temperature of the melt for enhancing dislocation-free growth of the crystal.

2. An apparatus for growing crystals from a melt of crystal-forming material comprising:

a processing chamber;

a crucible mounted in said processing chamber for containing the melt of crystal-forming material and having an open end through which the crystal can be pulled from the melt;

a heater that maintains the crystal-forming material in a melted condition within the crucible;

a temperature monitor that senses a temperature of the melt in the vicinity of a solidification between the crystal and the melt;

a radiation regulator that is adjustable for regulating radiational cooling of the melt;

a control system that adjusts the radiation regulator in response to changes in the sensed temperature of the melt for enhancing dislocation-free growth of the crystal: and said temperature monitor including a probe that extends into said processing chamber.

3. The apparatus of claim 2 in which said probe has a sight tube for transmitting radiant energy to an optical sensor.

4. The apparatus of claim 1 in which said temperature monitor senses the temperature of the melt within a distance of 50 mm of the crystal.

5. The apparatus of claim 4 in which said temperature monitor collects radiant energy from a spot on a surface of the melt measuring less than 20 mm in diameter.

6. The apparatus of claim 1 in which said radiation shield covers an area of the open end of the crucible for returning radiated heat to the melt.

7. The apparatus of claim 6 in which said radiation shield has at least two movable parts for adjusting the amount of covered area.

8. The apparatus of claim 7 in which said radiation shield has an opening through which the crystal can be pulled from the melt.

9. The apparatus of claim 8 in which said at least two relatively movable parts adjust a size of said opening through with said crystal can be pulled from the melt.

10. The apparatus of claim 9 in which said radiation shield includes an iris diaphragm formed by overlapping plates that can be adjusted to vary the size of said opening.

11. The apparatus of claim 6 in which said radiation shield is relatively movable with respect to a surface of the melt for regulating the return of radiated heat to the melt.

12. The apparatus of claim 11 in which said control system adjusts a position of the radiation shield with respect to the melt in response to the changes in the sensed temperature of the melt.

13. The apparatus of claim 6 in which said control system adjusts the area covered by the radiation shield in response to the changes in the sensed temperature of the melt.

14. The apparatus of claim 13 in which said control system increases the area covered by the radiation shield in response to a decrease in the sensed temperature of the melt.

15. The apparatus of claim 13 in which said control system decreases the area covered by the radiation shield in response to an increase in the sensed temperature of the melt.

16. The apparatus of claim 13 further comprising a diameter monitor that senses a diameter of the crystal in the vicinity of a solidification between the crystal and the melt.

17. The apparatus of claim 16 in which said control system varies a rate of pulling the crystal from the melt in response to sensed diameter variations in the crystal.

18. The apparatus of claim 17 in which said control system interrelates variations in the sensed temperature of the melt and variations in the pulling rate for adjusting the area covered by the radiation shield.

19. The apparatus of claim 13 in which said control system varies an amount of heat produced by said heater in response to variations in the amount of area covered by the radiation shield.

* * * * *